(12) United States Patent
Yoon et al.

(10) Patent No.: US 7,179,505 B2
(45) Date of Patent: Feb. 20, 2007

(54) MANUFACTURING METHOD OF MOSI₂-SIC NANOCOMPOSITE COATING

(75) Inventors: Jin-Kook Yoon, Seoul (KR);
Gyeung-Ho Kim, Seoul (KR);
Kyung-Tae Hong, Seoul (KR);
Jung-Man Doh, Seoul (KR);
Jong-Kwon Lee, Seoul (KR);
Kyung-Hwan Lee, Seoul (KR);
Keun-Hyung Son, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 3 days.

(21) Appl. No.: 11/023,428

(22) Filed: Dec. 29, 2004

(65) Prior Publication Data
US 2006/0003567 A1  Jan. 5, 2006

(30) Foreign Application Priority Data
Jul. 1, 2004  (KR) ...................... 10-2004-0051245

(51) Int. Cl.
*C23C 16/32* (2006.01)
*C23C 16/42* (2006.01)

(52) U.S. Cl. ........................... 427/249.15; 427/255.28; 427/255.7

(58) Field of Classification Search ............. 427/249.1, 427/255.29, 255.7, 255.28, 249.15
See application file for complete search history.

(56) References Cited

U.S. PATENT DOCUMENTS 5,364,513 A * 11/1994 Sekhar et al. .......... 204/290.02
5,472,487 A    12/1995 Chin et al.
5,876,659 A *  3/1999 Yasutomi et al. ........... 264/638
5,887,241 A *  3/1999 Jayashankar et al. ......... 419/14
5,990,025 A * 11/1999 Suyama et al. ............... 501/92
6,737,463 B2 * 5/2004 Yadav et al. ................. 524/435
6,979,490 B2 * 12/2005 Steffier .................... 428/292.1
2003/0207976 A1* 11/2003 Yadav et al. ................. 524/435
2005/0004293 A1*  1/2005 Peng et al. .................. 524/439

FOREIGN PATENT DOCUMENTS

KR    2003-0074918 A    9/2003

\* cited by examiner

*Primary Examiner*—Bret Chen
(74) *Attorney, Agent, or Firm*—Morrison & Foerster LLP

(57) ABSTRACT

The embodiments of the invention relate to a $MoSi_2$-SiC nanocomposite coating layer formed on surfaces of refractory metals such as Mo, Nb, Ta, W and their alloys. The $MoSi_2$-SiC nanocomposite coating layer is manufactured by forming a molybdenum carbide (MoC and $MoC_2$) coating layers on the surfaces of the substrates at high temperature, and the subsequent vapor-deposition of Si. The $MoSi_2$-SiC nanocomposite coating layer has a microstructure in which SiC particles are mostly located on the equiaxed $MoSi_2$ grain boundary. The $MoSi_2$-SiC nanocomposite coating layer can have a close thermal expansion coefficient to that of the substrate by controlling a volume fraction of SiC particles exisiting in the nanocomposite coating. As a result, the generation of cracks due to the mismatch in the thermal expansion coefficients between the substrate and the nanocomposite coating layer is suppressed and the high-temperature repeated thermal cyclic oxidation resistance and the low-temperature oxidation resistance of the coated substrate are improved.

15 Claims, 5 Drawing Sheets

MANUFACTURING METHOD OF MOSI₂-SIC NANOCOMPOSITE COATING

BACKGROUND OF THE INVENTION

1. Field of the Invention

The present invention relates to the $MoSi_2$ coating with excellent oxidation resistance and corrosion resistance.

2. Description of the Background Art

Refractory metals such as Mo, Nb, Ta or W have high strength and hardness at a high temperature, and shows more excellent mechanical and thermal properties at a high temperature than other metals because they have low vapor pressures and thermal expansion coefficients. Therefore, the refractory metals have been used as a core material in the field of aerospace, atomic energy, etc.

Among the refractory metals, Mo and W easily react with oxygen even at low temperature, to form volatile $MoO_3$ and $WoO_3$. Accordingly, the use of Mo and W are restricted to non-oxidizing atmosphere. In addition, Nb and Ta react with oxygen at high temperature, to form $Nb_2O_5$ and $Ta_2O_5$. Since diffusion of oxygen through these oxides is very fast, $Nb_2O_5$ and $Ta_2O_5$ cannot be used as an oxide film for protecting Nb and Ta.

To improve high-temperature oxidation resistance of the refractory metals or their alloys, metal silicide ($MeSi_2$, Me=Mo, Nb, Ta or W) coating with excellent high-temperature oxidation resistance has been developed. Among the metal silicides, $NbSi_2$ and $TaSi_2$ react with oxygen at high temperature, to form mixed oxide layers including $Nb_2O_5$ and $SiO_2$, and $Ta_2O_5$ and $SiO_2$, respectively. However, since diffusion of oxygen through $Nb_2O_5$ and $Ta_2O_5$ layers is very fast, the mixed oxide layers are rapidly grown. When the cyclic oxidation is repeated between high temperature and low temperature, the mixed oxide layer is easily peeled off the substrate by thermal stress due to difference in thermal expansion coefficient between the mixed oxide layer and the substrate. Thus, $NbSi_2$ and $TaSi_2$ are not suitable for a high-temperature oxidation resistance coating to protect the refractory metals or their alloys.

Among the metal silicides, $MoSi_2$ and $WSi_2$ react with oxygen at high temperature, to form $MoO_3$ and $SiO_2$, and $WO_3$ and $SiO_2$, respectively. $MoO_3$ and $WO_3$ are easily vaporized over temperature of about 700 to 800° C., and as a result an adherent and continuous silicon oxide ($SiO_2$) film is formed on the surfaces of $MoSi_2$ and $WSi_2$. Since diffusion of oxygen through the $SiO_2$ film is very slow, the $SiO_2$ film can protect the substrates from further oxidation. However, major obstacle for application of $MoSi_2$ coating is structural disintegration during low temperature oxidation at about 400 to 600° C. (the so-called, pest oxidation), and $WSi_2$ is disintegrated at about 1000 to 1200° C. $MoSi_2$ is known to have more excellent oxidation resistance at a high temperature than $WSi_2$. Accordingly, if $MoSi_2$ is coated on the surface of the refractory metals, the coated refractory metals can be more widely used.

As coating processes to form $MoSi_2$ coating, a slurry method is an easy process to manufacture the $MoSi_2$ coating on alloy, but has a drawback of generating a lot of pores in the coating layer.

Direct coating of $MoSi_2$ by low pressure plasma spraying method is also easy to manufacture the $MoSi_2$ coating on alloy, but cannot properly control compositions and obtain the $MoSi_2$ coating layer without defects.

Reactive diffusion methods such as a pack siliconizing, a chemical deposition and solution growth into molten Si—In alloy is a relatively inexpensive, highly versatile, easily handled, and commercially feasible diffusion coating process. In the pack siliconizing and the chemical vapor deposition, Si is deposited from a gas phase on a surface of a substrate, whereas in the solution growth Si is deposited from liquid phase.

In relation to thermal and mechanical properties, the following three factors mostly influence a commercialization of the $MoSi_2$ coating layer.

(1) Interdiffusion of substrate and $MoSi_2$ coating layer;

(2) Thermal stress due to the difference in thermal expansion coefficients between the substrate and the $MoSi_2$ coating layer ($8.5\times10^{-6}$/° C.) or between the $MoSi_2$ coating layer and the silicon oxide layer ($0.5\times10^{-6}$/° C.); and (3) Low-temperature oxidation (pest oxidation) of $MoSi_2$ coating layer under air at about 400 to 600° C. and resultant decomposition into $MoO_3$ and $SiO_2$ powders Accordingly, in the practical applications, the lifetime of the $MoSi_2$ coating layer on the refractory metals or their alloys depends on the using conditions.

In the case of isothermal oxidation (an oxidation for a long time at high temperature), Si is supplied to the substrate due to interdiffusion of the refractory metal substrate and the $MoSi_2$ coating layer. As a result, the $MoSi_2$ coating layer is transformed into an $(Me,Mo)_5Si_3$ coating layer without oxidation resistance, and thus cannot be used as a coating layer for protecting substrates. In this case, the increase in the thickness of the $MoSi_2$ coating layer can improve the lifetime of the coating layer.

However, for applications of $MoSi_2$ coating in air at elevated temperatures, service requirements often include conditions of thermal cycling. On reheating, the cracks are closed by thermal expansion and may heal by diffusion. They may reopen or new cracks may form during cooling. During the heating cycle, oxidants can have access to the interior of the coating along these cracks, and oxides may form in the cracks which will prevent complete healing at high temperatures. With repeated temperature cycling, many of the cracks remain open and allow oxidation to continue within the coating. As a result, the substrate is directly exposed to oxygen in the atmosphere, and thus rapidly oxidized.

In addition, when the $MoSi_2$ coating is used at 400 to 600° C., the $MoSi_2$ coating layer is rapidly oxidized to form $MoO_x$ and silicon oxides (pest oxidation). During the pest oxidation, the $MoSi_2$ coating layer is decomposed into powders due to volume expansion of about 250% induced by complete oxidation of $MoSi_2$ phase into the $MoO_3$ and $SiO_2$ phases. The decomposed $MoSi_2$ coating layer does not have low-temperature oxidation resistance. Accordingly, the repeated thermal cyclic oxidation resistance, low-temperature oxidation resistance, and high-temperature oxidation resistance should be excellent to wide applications of the refractory metals or their alloys coated with the $MoSi_2$.

SUMMARY OF THE INVENTION

Therefore, an object of the present invention is to provide the $MoSi_2$ coating layer which can improve isothermal oxidation resistance and repeated thermal cyclic oxidation resistance at high temperature and low-temperature oxidation resistance, and which can also improve high-temperature mechanical properties.

To achieve these and other advantages and in accordance with the purpose of the present invention, as embodied and broadly described herein, the present invention provides the $MoSi_2$—SiC nanocomposite coating layer coated on a surface of refractory metals such as Mo, Nb, Ta, W and their alloys. The MoSi$_2$—SiC nanocomposite coating layer has a microstructure that SiC particles are mostly located in an equiaxed MoSi$_2$ grain boundary. In the coating, the average size of MoSi$_2$ grains is below about 200 to 300 nm, and the average size of SiC particles is below about 100 nm. The thermal expansion coefficient of the MoSi$_2$—SiC nanocomposite coating layer becomes close to that of a substrate by controlling the volume fraction of SiC particles therein.

According to another aspect of the present invention, the present invention provides a manufacturing method of the MoSi$_2$-(18–20) vol. % SiC nanocomposite coating layer (Method 1), comprises: (a) forming an Mo$_2$C. diffusion layer by vapor-deposition of carbon on surfaces of substrates made of Mo and Mo-alloys thereof; and (b) forming an MoSi$_2$—SiC nanocomposite coating layer by vapor-deposition of silicon on the surface of the Mo$_2$C. diffusion layer.

According to yet another aspect of the present invention, the present invention provides a manufacturing method of the MoSi$_2$-(18–20) vol. % SiC nanocomposite coating layer (Method 2), comprises: (a) forming an Mo$_2$C. coating layer by simultaneously vapor-deposition of carbon and Mo on surfaces of refractory metals such as Nb, Ta, W, Mo and their alloys thereof; and (b) forming an MoSi$_2$—SiC nanocomposite coating layer by vapor-deposition of silicon on the surface of the Mo$_2$C. coating layer.

According to yet another aspect of the present invention, the present invention provides a manufacturing method of the MoSi$_2$-(30–33) vol. % SiC nanocomposite coating layer (Method 3), comprises: (a) forming an MoC coating layer by simultaneously vapor-deposition of carbon and Mo on surfaces of refractory metals such as Nb, Ta, W, Mo and their alloys; and (b) forming an MoSi$_2$—SiC nanocomposite coating layer by vapor-deposition of silicon on the surface of the MoC coating layer.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

In accordance with the present invention, the MoSi$_2$—SiC nanocomposite coating layer is coated on the surface of refractory metals such as Mo, Nb, Ta, W, or their alloys. The coating layer has a microstructure in which SiC particles are mostly located on an equiaxed MoSi$_2$ crystal grain boundary.

In the MoSi$_2$—SiC nanocomposite coating layer, a microstructure of MoSi$_2$ has an equiaxed grain structure. The thermal expansion coefficient of the MoSi$_2$—SiC nanocomposite coating layer can be close to those of substrates by controlling the volume fraction of SiC particles therein. Accordingly, the fine cracks which are generated by a thermal stress due to the difference in thermal expansion coefficients between the substrate and the coating layer is reduced or eliminated.

In the MoSi$_2$—SiC nanocomposite coating layer, SiC is preferentially formed on the MoSi$_2$ grain boundary due to limited solid solubility in MoSi$_2$.

The thermal expansion coefficient of SiC is about 4×10$^{-6}$/° C., which serves to reduce the thermal expansion coefficient (8.5×10$^{-6}$/° C.) of pure MoSi$_2$ to be close to that of the substrates (refer to Table 1), thereby suppressing the generation of fine cracks and improving high-temperature repeated thermal cyclic oxidation resistance of the substrate.

TABLE 1

Physical properties of Mo, Nb, Ta and W

| Physical properties | Mo | Nb | Ta | W |
|---|---|---|---|---|
| Melting point (° C.) | 2617 | 2468 | 2996 | 3410 |
| Density (g/cm$^3$) | 10.2 | 8.6 | 16.7 | 19.3 |
| Brittle-ductile transition (° C.) | 30 | −125 | −273 | 300 |
| Thermal expansion coefficient (10$^{-6}$/K) (average value from 20–1000° C.) | 4.8 | 7.3 | 6.3 | 4.5 |
| Elastic modulus (Gpa) at 1000° C. | 280 | 110 | 170 | 365 |

When oxygen is diffused through the MoSi$_2$ grain boundary under the oxidative atmosphere, SiC easily forms SiO$_2$ film. As a result, oxygen cannot be diffused any more through the MoSi$_2$ grain boundary, thereby improving low-temperature oxidation resistance of the MoSi$_2$—SiC nanocomposite coating layer in comparison with a pure MoSi$_2$ coating layer. Compared with a MoSi$_2$—SiC composite sintered pellet, the MoSi$_2$—SiC nanocomposite coating layer can efficiently restrict oxygen diffusion through its grain boundary with a relatively small amount of SiC particles.

In addition, SiC restricts MoSi$_2$ grain growth, and thereby prevents mechanical properties of the coating layer from being deteriorated due to grain coarsening.

The following two methods to manufacture the MoSi$_2$-(18–20) vol. % SiC nanocomposite coating layer are selectively used depending on the kinds of substrates.

First, in case of the MoSi$_2$-(18–20)vol. % SiC nanocomposite coating layer on the surface of Mo or Mo-base alloys, the manufacturing method (Method 1) comprises: (a) forming the Mo$_2$C diffusion layer by vapor-deposition of carbon on the surface of the substrates; and (b) forming an MoSi$_2$-(18–20) vol. % SiC nanocomposite coating layer by vapor-deposition of silicon on the surface of the Mo$_2$C diffusion layer.

Second, in case of the MoSi$_2$-(18–20) vol. % SiC nanocomposite coating layer on surface of Nb, Ta, W, or their alloy, the manufacturing method (Method 2) comprises: (c) forming an Mo$_2$C coating layer by simultaneously vapor-deposition of carbon and Mo on the surfaces of the substrates; and (d) forming an MoSi$_2$-(18–20) vol. % SiC nanocomposite coating layer by vapor-deposition of silicon on the surface of the Mo$_2$C coating layer.

It is also possible to form the MoSi$_2$-(18–20) vol. % SiC nanocomposite coating layer on the surface of Mo or Mo-base alloys by to the second method.

In the step (a), carbon is deposited on the surface of the substrate such as Mo or Mo-base alloys under H$_2$ atmosphere at high temperature by chemical vapor deposition. As a carbon source for chemical deposition, one among CO, CH$_4$, C$_2$H$_4$ or CH$_2$I$_2$ gases can be selected.

The carbon deposited on the surface chemically reacts with the substrate, to form the Mo$_2$C diffusion layer. As the deposition time increases, carbon diffuse form the surface to the Mo$_2$C/Mo interface through the Mo$_2$C diffusion layer, and then reacts with Mo to continuously form the Mo$_2$C diffusion layer.

After the Mo$_2$C diffusion layer with a predetermined thickness is formed on the surface of the substrate, with maintaining the deposition temperature and using one among SiC$_4$, SiH$_2$Cl$_2$, SiH$_3$Cl and SiH$_4$ gases, silicon is deposited on the surface of Mo$_2$C layer in the step (b), for a predetermined time by chemical vapor deposition.

A pack siliconizing method using powders composed of (1–70)wt % Si/(1–10)wt % NaF/(20–98)wt % Al$_2$O$_3$ can be used for the deposition of Si. The powders for pack siliconizing includes Si powder (for providing Si in manufacturing the MoSi$_2$—SiC nanocomposite coating layer), NaF powder (an activating agent reacting with Si powder to form SiF$_x$ (x=1, 2, 3 and 4) gas), and Al$_2$O$_3$ powder (for preventing Si powder and NaF powder from being sintered during the high-temperature coating). The powders measured by the respective composition as above are uniformly mixed for over 24 hours. The mixed powders are put into an alumina crucible, and a sample coated with a predetermined thickness of Mo$_2$C diffusion layer is buried in the powders and thermal-treated under an inert or reductive atmosphere for a predetermined time, to manufacture the MoSi$_2$—SiC nanocomposite coating layer.

Deposited silicon reacts with Mo$_2$C, to form MoSi$_2$ and SiC phases through solid-state displacement reaction, according to the following chemical reaction (a):

$$Mo_2C + 5Si \rightarrow 2MoSi_2 + SiC \qquad (a)$$

Since the solubility of carbon in MoSi$_2$ phase is very low, SiC particles are mostly located on the MoSi$_2$ grain boundary.

Silicon deposited on the surface of the Mo$_2$C layer migrates inside through the MoSi$_2$—SiC nanocomposite coating layer, and reacts with the Mo$_2$C diffusion layer to form new MoSi$_2$ and SiC particles. Accordingly, the MoSi$_2$-(18–20) vol. % SiC nanocomposite coating layer with a thickness of a few tens to a few hundreds micrometers can be obtained.

In the step (c), the Mo$_2$C coating layer is formed by simultaneous deposition of carbon and Mo on the surface of the substrate such as Nb, Ta, W, or their alloy. As a carbon source for chemical vapor deposition, one among CO, CH$_4$, C$_2$H$_2$ and CH$_2$I$_2$ gases can be selected, and a Mo source, one among Mo(CO)$_6$, MoCl$_5$ and MoF$_6$ can be selected.

Since Nb, Ta and their alloy are liable to be brittle under H$_2$ atmosphere at high temperature, a high purity Ar atmosphere is preferable during heating the substrate such as Nb, Ta and their alloy in the step (c). On the contrary, in case of Mo, W or their alloys thereof, a high purity H$_2$ atmosphere is maintained during the heating.

After the Mo$_2$C diffusion layer with a predetermined thickness is formed on the surface of the substrate, in the step (d), with maintaining the deposition temperature and using one among SiCl$_4$, SiH$_2$Cl$_2$, SiH$_3$Cl and SiH$_4$ gases, silicon is deposited for a predetermined time by chemical vapor deposition.

A pack siliconizing method using powders composed of (1–70)wt % Si/(1–10)wt % NaF/(20–98)wt % Al$_2$O$_3$ can be used for the deposition of silicon.

In addition, the third method of manufacturing a MoSi$_2$-(30–33) vol. % SiC nanocomposite coating layer (Method 3) comprises: (a) forming an MoC coating layer by simultaneously depositing carbon and Mo on the surface of refractory metals such as Mo, Nb, Ta, W or their alloy; and (b) forming an MoSi$_2$-(30–33) vol. % SiC nanocomposite coating layer by depositing silicon on the surface of the MoC coating layer.

In Mo—C binary system, there exist two kinds of molybdenum carbides (MoC and Mo$_2$C). Mo$_2$C is stable at high temperature, but MoC is unstable at high temperature. When MoC is heated at high temperature under H$_2$, Ar, N$_2$ or vacuum atmosphere, the MoC phase is easily decomposed into the Mo$_2$C and carbon phases.

In general, when the molybdenum carbide phases (MoC or Mo$_2$C) are prepared by vapor-deposition of carbon on the surface of the Mo substrate, a growth rate of carbides increases in proportion to the deposition temperature exponentially or in proportion to a square root of the deposition time at a constant deposition temperature. Thus, the deposition of carbon at high temperature is advantageous to obtain a desired thickness of molybdenum carbide within a short time. However, considering the unstability of MoC phase at high temperature, the deposition temperature must be maintained between 660 and 920° C. to prepare MoC carbide by vapor-deposition of carbon on the surface of the Mo substrate. That is, although high deposition temperature is required to prepare a predetermined thickness of MoC layer in a short time, carbon should be deposited at below 920° C. for a long time because the deposition temperature over 920° C. makes it impossible to form MoC layer. On the contrary, Mo$_2$C that is stable at high temperature can be prepared by vapor-deposition of carbon at 1200 to 1500° C.

In the step (a) of the method 3, after maintaining the refractory metal such as Mo, Nb, Ta, W or their alloy at high temperature, the MoC coating layer is then formed by simultaneous vapor-deposition of carbon and Mo on the surface of the refractory metal. As a carbon source for chemical vapor deposition, one among CO, $CH_4$, $C_2H_2$ or $CH_2I_2$ gases can be selected, and as a Mo source, one among $Mo(CO)_6$, $MoCl_5$ or $MoF_6$ can be selected.

Since Nb, Ta and their alloy are liable to be brittle under $H_2$ atmosphere at high temperature, a high purity Ar atmosphere is preferable during heating the substrate such as Nb, Ta and their alloy in the step (a). On the contrary, in case of Mo, W or their alloys thereof, a high purity $H_2$ atmosphere is maintained during the heating.

The MoC coating layer formed by simultaneous vapor-deposition of carbon and Mo on the surface of the substrate continuously grows in proportion to the deposition time.

In the step (b) of the method 3, after forming the MoC coating layer with a predetermined thickness on the surface of the substrate, silicon is then deposited for a predetermined time by chemical vapor deposition using $SiC_4$, $SiH_2Cl_2$, $SiH_3Cl$ or $SiH_4$.

In this case, a pack siliconizing method using a pack siliconizing powder having a composition of (1–70)wt % Si/(1–10)wt % NaF/(20–98)wt % $Al_2O_3$ can be used for deposition of silicon.

Deposited silicon reacts with MoC to form $MoSi_2$ and SiC phases by solid-state displacement reaction according to the following reaction (b):

MoC+3Si –>$MoSi_2$+SiC     (b)

Since the solubility of carbon in $MoSi_2$ phase is very low, SiC particles are mostly formed on the $MoSi_2$ grain boundary.

The silicon deposited on the surface of the MoC coating layer diffuse inwardly through the $MoSi_2$—SiC nanocomposite coating layer, and reacts with the MoC coating layer to form new $MoSi_2$ and SiC particles. Accordingly, the $MoSi_2$-(30–33) vol. % SiC nanocomposite coating layer with a thickness of a few tens to a few hundreds micrometers can be obtained.

The above-described manufacturing methods of the $MoSi_2$—SiC nanocomposite coating layer (Methods 1 to 3) will now be compared with each other.

When the $MoSi_2$—SiC nanocomposite coating layer is manufactured according to the chemical reaction formula (a) (Methods 1 and 2), the theoretical volume fraction of SiC particles is calculated by using molar volume of $MoSi_2$ (24.4 $cm^3$/mol) and SiC 12.61 $cm^3$/mol) as follows;

SiC vol %=[12.61/(12.61+2×24.4)]×100=20.5%.

The experimental volume fraction of SiC particles is about 18 to 20%.

When the $MoSi_2$—SiC nanocomposite coating layer is manufactured by chemical reaction formula (b) according to Method 3, the theoretical volume fraction of SiC particles is calculated as follows.

SiC vol %=[12.61/(12.61+24.4)]×100=34.1%.

The experimental volume fraction of SiC particles is about 30 to 33%.

When the $MoSi_2$—SiC nanocomposite coating layer is manufactured using a molybdenum carbide layer, the volume fraction of SiC phase existing in the nanocomposite coating layer can be controlled with respect to the carbon concentration in molybdenum carbide layers. Thus, the thermal expansion coefficients of the substrates and the nanocomposite coating layer can become close to each other, so that many cracks generated by the thermal stress due to the mismatch of thermal expansion coefficient can be remarkably reduced, and in some cases the crack-free $MoSi_2$—SiC nanocomposite coating layer can be obtained.

EXAMPLE 1

A $MoSi_2$-(18–20) vol. % SiC nanocomposite coating layer was manufactured according to Method 1. Mo with a purity of 99.95% and a size of 10 mm×10 mm×1 mm was prepared. Mo metal plates (99.95% purity) were cut into pieces of 10 mm×10 mm×1 mm and then polished successively using SiC papers and 1 µm diamond paste. The polished pieces were ultrasonically cleaned in acetone, alcohol, distilled water, and then dried.

The Mo sample was put into a high purity alumina reaction tube for chemical vapor deposition of carbon. High purity Ar gas. (99.9999%) was injected into the reaction tube to remove oxygen. Metal oxides that may exist on the surface of the Mo metal were reduced by heating the substrate to 800 to 1400° C. at a heating speed of 5 to 20° C./min with the flow of high purity $H_2$ (99.9999%) or high purity Ar at a flow rate of 100 to 2000 cm/min. The substrate was maintained for about 10 to 20 minutes to stabilize a deposition temperature. Carbon was deposited on the surface of the Mo metal for 10 minutes to 200 hours by supplying methane gas and $H_2$ gas at a flow rate of 3 to 2000 cm/min, respectively.

Carbon deposited on the surface of the substrate chemically reacted with Mo to form a $Mo_2C$ diffusion layer. As the deposition time increases, carbon deposited on the surface diffused inwardly from the surface to the $Mo_2C$/Mo interface through the $Mo_2C$ diffusion layer, and reacted with new Mo, thereby to continuously form the $Mo_2C$ diffusion layer. The $Mo_2C$ diffusion layer was grown in proportion to a square root of the deposition time.

Accordingly, the deposition temperature and time for manufacturing a specific thickness of $Mo_2C$ diffusion layer could be kinetically calculated. For example, when carbon is chemically vapor-deposited at 1200° C. for about 65 hours, $Mo_2C$ diffusion layer with thickness of about 46 µm is grown on the surface of the Mo metal.

After the $Mo_2C$ diffusion layer with a predetermined thickness was formed, the supply of methane gas was stopped, and the temperature was reduced to 1100° C. at a speed of 5° C./min with supply of $H_2$ or Ar to the reaction tube at a flow rate of 30 to 3000 cm/min. Thereafter, silicon was chemically vapor-deposited on the surface of the $Mo_2C$ diffusion layer for 30 minutes to 30 hours by supplying $SiCl_4$ and $H_2$ gas to the reaction tube, wherein a flow rate ratio $SiCl_4$ and $H_2$ was about 0.005 to 0.5 and a total flow rate was about 30 to 4000 cm/min.

The deposited silicon formed $MoSi_2$ and SiC phases by solid phase substitution reaction with $Mo_2C$ phase. As the deposition time elapses, deposited silicon migrated inwardly through the $MoSi_2$—SiC nanocomposite coating layer, and reacted with the $Mo_2C$ diffusion layer to form new $MoSi_2$ and SiC particles, thereby the $MoSi_2$-(18–20) vol. % SiC nanocomposite coating layer was obtained.

The thickness of the $MoSi_2$-(18–20) vol. % SiC nanocomposite coating layer was grown in proportion to the square root of the vapor deposition time of silicon. Therefore, the deposition temperature and time for manufacturing a specific thickness of nanocomposite coating layer could be kinetically calculated. For example, when silicon is deposited on the surface of the $Mo_2C$ diffusion layer at the deposition temperature of 1100° C. for 5 hours and is reactively diffused into the $Mo_2C$, about 65 µm of $MoSi_2$-(18–20) vol. % SiC nanocomposite coating layer with excellent oxidation resistance and corrosion resistance could be manufactured on the surface of Mo.

The manufactured nanocomposite coating layer was furnace-cooled to a room temperature under supply of high purity $H_2$ or Ar gas at a flow rate of 100 to 2000 cm/min.

$H_2$ and $SiCl_4$ gas used in Example 1 were high purity gases used in the semiconductor fields. Especially, $SiCl_4$ gas has an evaporation temperature of about 54° C. In this experiment, SiCl4 was introduced into the reactor tube from a $SiCl_4$ bubbler by bubbling $H_2$ through the $SiCl_4$ solution maintained at 0 to 30° C. The chemical vapor deposition was carried out in a tube furnace having a high purity alumina tube having an inside diameter of about 20 mm.

Silicon was also deposited by pack siliconizing process. For the pack siliconizing, Mo or Mo-base alloys coated with a predetermined thickness of $Mo_2C$ diffusion layer was buried in powders having a composition of (1–70)wt % Si/(1–10)wt % NaF/(20–98)wt % $Al_2O_3$, and put into a pack siliconizing reaction tube.

Then, removing oxygen inside the reaction tube with high purity Ar gas, heating the reaction tube to 800 to 1400° C. at a heating speed of 5 to 20° C./min with supply of high purity $H_2$ or Ar at a flow rate of 100 to 2000 cm/min, and maintaining the reaction tube for 30 minutes to 30 hours, silicon was chemically vapor-deposited on the surface of the substrate and reactively diffused into $Mo_2C$, The $MoSi_2$-(18–20) vol. % SiC nanocomposite coating layer manufactured on the surface of the substrate was furnace-cooled to a room temperature with supply of high purity $H_2$ or Ar at a flow rate of 100 to 2000 cm/min.

The thickness of the $MoSi_2$-(18–20) vol. % SiC nanocomposite coating layer manufactured by pack siliconizing was grown in proportion to a square root of the deposition time of silicon. Therefore, the deposition temperature and time for manufacturing a specific thickness of composite coating layer could be kinetically calculated.

The pack siliconizing powder was prepared by measuring 50 g of powders having a composition of (1–70)wt % Si/(1–10)wt % NaF/(20–98)wt % $Al_2O_3$, and mixing the powders for 24 hours using a mixer moving rotationally and vertically. Si powders had purity of 99.5% and an average grain size of 44 µm, an activating agent was reagent-level NaF, and a filling agent was high purity alumina having an average size of 44 µm.

The pack siliconizing was processed in a reaction tube (Inconel 600) with an inside diameter of 60 mm at a temperature below 1100° C., and in a high purity alumina tube at a temperature over 1200° C. The mixed pack siliconizing powders was filled in 40 cc of high purity alumina crucible, the Mo metals coated with the $Mo_2C$ diffusion layer were buried at the center of the powders, and an alumina cover was covered thereon.

Figure 1A:
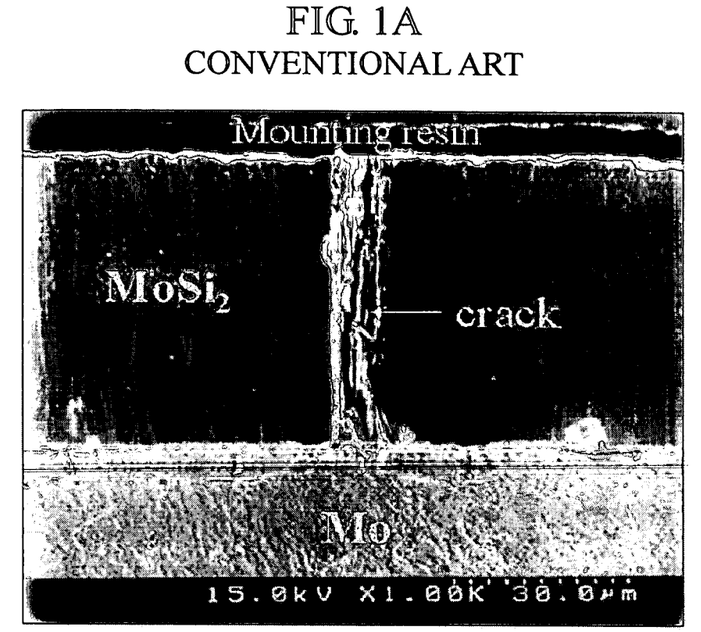
FIGS. 1a and 1b are SEM photographs respectively showing a cross section and a surface of an MoSi$_2$ coating layer having a columnar structure formed on a surface of an Mo substrate according to conventional reaction diffusion methods such as a chemical vapor deposition, a pack siliconizing and a solution growth.
Figure 1B:
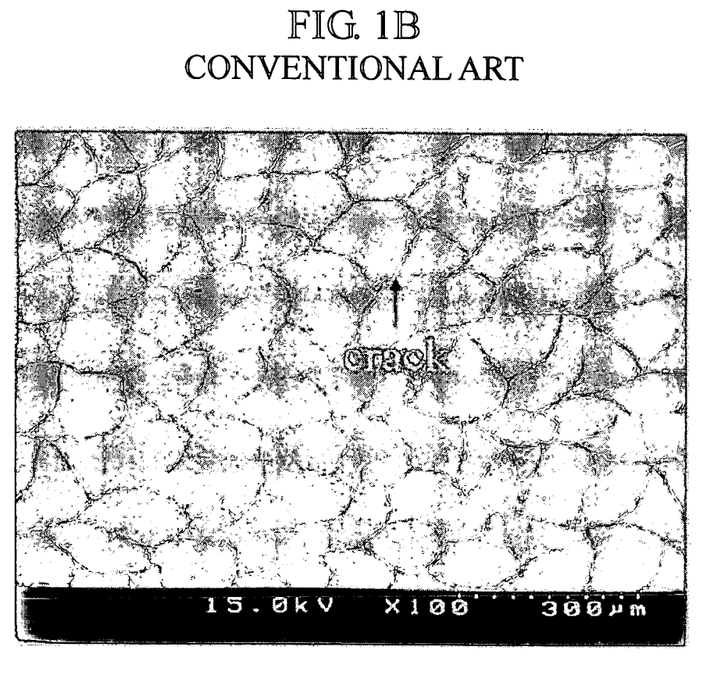
Figure 2A:
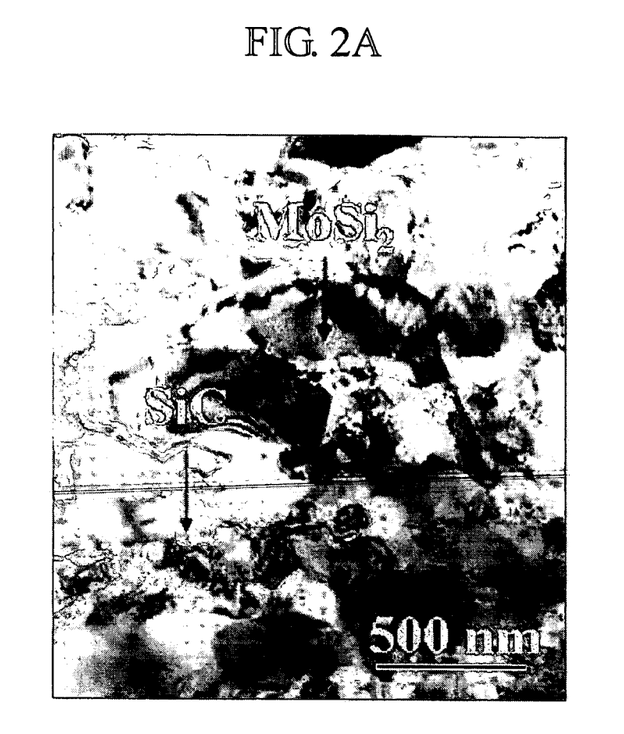
FIGS. 2a and 2b are a TEM photograph and an OM photograph, respectively showing a cross section and a surface of an MoSi$_2$-(18–20) vol. % SiC nanocomposite coating layer formed on a surface of an Mo substrate according to a manufacturing method of Example 1 in accordance with the present invention.
Figure 2B:
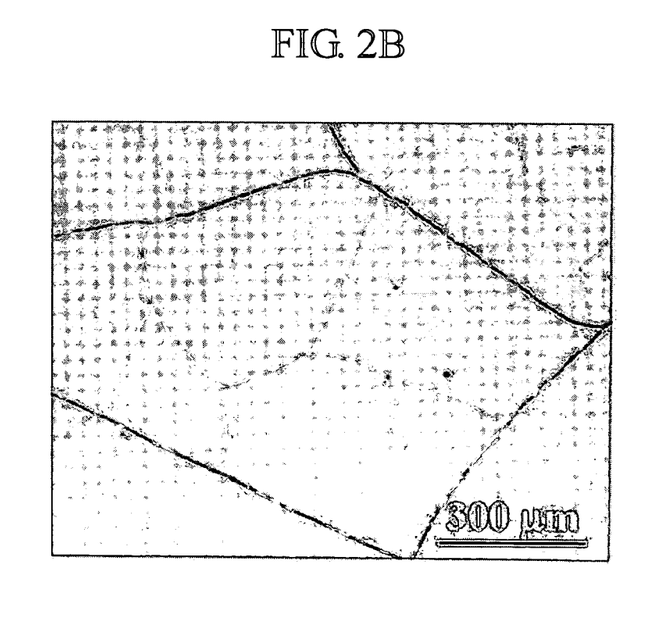

FIGS. 1a and 1b are SEM photographs respectively showing a cross-section and a surface of a monolithic $MoSi_2$ coating layer with a typical columnar microstructure manufactured by conventional reactive diffusion processes, and FIGS. 2a and 2b are a TEM photograph and an OM photograph respectively showing a cross-section and a surface of an $MoSi_2$-(18–20) vol. % SiC nanocomposite coating layer manufactured according to the manufacturing method of Example 1 in accordance with the present invention.

The monolithic $MoSi_2$ coating layer will now be compared with the $MoSi_2$-(18–20) vol. % SiC nanocomposite coating layer manufactured in Example 1 of the present invention.

Referring to FIGS. 2a and 2b, in the $MoSi_2$-(18–20) vol. % SiC nanocomposite coating layer according to Example 1, ultrafine SiC particles are precipitated on an equiaxed $MoSi_2$ grain boundary. When measured by an image analyzer, an average size of equiaxed $MoSi_2$ grains is about 300 nm, and an average size and a volume fraction of SiC precipitated particles are about 80 to 100 nm and 18 to 20%, respectively.

In addition, SiC particles are mostly formed on the $MoSi_2$ grain boundary to prohibit growth of $MoSi_2$ grains. Accordingly, the equiaxed $MoSi_2$ coating layer having an average grain size of about 300 nm can be obtained.

On the contrary, as illustrated in FIGS. 1a and 1b, the monolithic $MoSi_2$ coating layer manufactured by depositing Si on the surface of Mo substrate according to the conventional method has a typical columnar microstructure.

Especially, still referring to FIGS. 2a and 2b, when crack density (the number of cracks per unit length of linear inspection on the cross-section) is calculated by observing the surface of the $MoSi_2$—SiC nanocomposite coating layer manufactured in Example 1 by using the optical microscope, the crack denisty is about 24 per cm which is a reduced value by about 35% compared to that of about 37 per cm in the monolithic $MoSi_2$ coating layer.

However, the $MoSi_2$-(18–20) vol. % SiC nanocomposite coating layer has a higher thermal expansion coefficient than the Mo substrate. Accordingly, when the nanocomposite coating layer is cooled down to the room temperature, a tensile stress is applied to the nanocomposite coating layer. Therefore, cracks cannot be completely removed.

EXAMPLE 2

In Example 2, an $MoSi_2$-(18–20)vol. % SiC nanocomposite coating layer was manufactured according to Method 2 on the surfaces of the refractory metals such as Nb, Ta, W, or their alloy.

Nb had purity of 99.9% and Ta and W had purity of 99.95%. Nb, Ta and W were manufactured as sheets having a size of 10 mm×10 mm×1 mm and then polished successively using SiC papers and 1 µm diamond paste. The polished pieces were ultrasonically cleaned in acetone, alcohol, distilled water, and then dried.

The substrates were put into a quartz reaction tube for the simultaneous chemical vapor deposition of carbon and Mo on the surfaces of the substrates. The reactor tube was evacuated to less than $5 \times 10^{-2}$ torr and backfilled with Ar gas and this procedure was repeated two times before chemical vapor deposition of Mo-carbide layer. Metal oxides that might exist on the surfaces of the substrates were reduced by heating the reaction tube to 500 to 1100° C. at a heating speed of 5 to 20° C./min with the flow of high purity $H_2$ (99.9999%) or high purity Ar at a flow rate of 100 to 2000 cm/min. The reaction tube was maintained for about 10 to 20 minutes to stabilize a deposition temperature. Next, carbon and Mo were simultaneously vapor-deposited on the surfaces of the substrates for 10 minutes to 50 hours, by supplying methane gas, $H_2$ and $MoCl_5$ gas at a flow rate of 3 to 2000 cm/min, and 5 to 2000 cm/min and 5 to 2000 cm/min, respectively.

Carbon and Mo deposited on the surfaces of the substrates chemically reacted with each other to form a $Mo_2C$ coating layer. The $Mo_2C$ coating layer was grown in proportion to the deposition time.

Accordingly, the deposition temperature and time to obtain a $Mo_2C$ coating layer with a predetermined thickness could be kinetically calculated. For example, when carbon and Mo are simultaneously vapor-deposited at a deposition temperature of 1100° C. for about 6 hours, Mo$_2$C coating layer with thickness of about 45 μm is grown on the surfaces of the substrates.

After a predetermined thickness of Mo$_2$C coating layer was formed, supply of methane gas and MoCl$_5$ gas was stopped, and H$_2$ or Ar was supplied to the reaction tube at a flow rate of 30 to 3000 cm/min for 1 to 10 minutes to remove methane gas and MoCl$_5$ gas that might exist in the reaction tube. Thereafter, silicon was chemically vapor-deposited on the surface of the Mo$_2$C diffusion layer for 30 minutes to 30 hours by supplying SiCl$_4$ and H$_2$ gases to the reaction tube, wherein a flow rate ratio SiCl$_4$ and H$_2$ was about 0.005 to 0.5 and a total flow rate was about 30 to 4000 cm/min. The resulting coating layer was furnace-cooled to the room temperature with supply of high purity H$_2$ or Ar gas at a flow rate of 100 to 2000 cm/min.

The deposited silicon formed MoSi$_2$ and SiC phases by solid-state displacement reaction with Mo$_2$C phase. As the deposition time increases, the deposited Si was inwardly diffused through the MoSi$_2$—SiC nanocomposite coating layer, and reacted with the Mo$_2$C diffusion layer to form new MoSi$_2$ and SiC particles, thereby manufacturing the MoSi$_2$—(18–20) vol. % SiC nanocomposite coating layer.

MoCl$_5$ gas used in Example 2 had purity of about 99.5%. Especially, MoCl$_5$ had a boiling point of about 286° C. In this experiment, the MoCl$_5$ was introduced into the reactor tube from a MoCl$_5$ sublimator containing MoCl$_5$ powder maintained at 30 to 200° C. using Ar as a carrier gas. All parts between the sublimator and the furnace were heated over a bubbler temperature to prevent the condensation of MoCl$_5$ gas by heating tapes. The CH$_4$ gas (>99% purity) was introduced into the reactor tube by a separate tube. The flow rates of MoCl$_5$ and CH$_4$ were fixed at 1~1000 cm/min and 1~1000 cm/min, respectively, and the total pressure of reactor during deposition was maintained at 2 torr.

Like as Example 1, the substrates coated with the Mo$_2$C coating layer were buried in powders having a composition of (1–70)wt % Si/(1–10)wt % NaF/(20–98)wt % Al$_2$O$_3$, and pack-siliconized at 1100° C. for 10 hours, thereby manufacturing the MoSi$_2$-(18–20) vol. % SiC nanocomposite coating layer.

The MoSi$_2$-(18–20) vol. % SiC nanocomposite coating layer manufactured in Example 2 had similar microstructures as those of Example 1.

EXAMPLE 3

In Example 3, an MoSi$_2$-(30–33) vol. % SiC nanocomposite coating layer was manufactured according to Method 3 on surfaces of refractory metals such as Mo, Nb, Ta, W, and their alloy.

Like as Example 1, the substrates were put into a quartz reaction for the simultaneous chemical vapor deposition of carbon and Mo on the surfaces of the preprocessed substrates. The reactor tube was evacuated to less than 5×10$^{-2}$ torr and backfilled with Ar gas and this procedure was repeated two times before chemical vapor deposition of Mo-carbide layer. Metal oxides that might exist on the surfaces of the substrates were reduced by heating the reaction tube to 500 to 1100° C. at a heating speed of 5 to 20° C./min with the flow of high purity H$_2$ (99.9999%) or high purity Ar at a flow rate of 100 to 2000 cm/min. The reaction tube was maintained for about 10 to 20 minutes to stabilize a deposition temperature. Carbon and Mo were simultaneously vapor-deposited on the surfaces of the substrates for 10 minutes to 20 hours, by supplying ethane gas and MoCl$_5$ gas at a flow rate of 3 to 2000 cm/min and 5 to 2000 cm/min, respectively.

Carbon and Mo deposited on the surfaces of the substrates chemically reacted with each other, to form the MoC coating layer. The MoC coating layer was grown in proportion to the deposition time.

Accordingly, the deposition temperature and time for manufacturing a specific thickness of MoC coating layer could be kinetically calculated. For example, when carbon and Mo are simultaneously vapor-deposited at a deposition temperature of 900° C. for about 5 hours, the MoC coating layer with thickness of about 25 μm is grown on the surfaces of the substrates.

After the MoC coating layer with a predetermined thickness was formed, supply of ethane gas and MoCl$_5$ gas was stopped, and H$_2$ or Ar was supplied to the reaction tube at a flow rate of 30 to 3000 cm/min for 1 to 10 minutes to remove ethane gas and MoCl$_5$ gas that may exist in the reaction tube. Thereafter, silicon was chemically vapor-deposited on the surface of the MoC coating layer for 30 minutes to 30 hours by supplying SiCl$_4$ and H$_2$ gas to the reaction tube, wherein a flow rate ratio SiCl$_4$ and H$_2$ was about 0.005 to 0.5 and a total flow rate was about 30 to 4000 cm/min. Then, the coating layer was furnace-cooled to the room temperature with supply of high purity H$_2$ or Ar at a flow rate of 100 to 2000 cm/min.

The deposited silicon formed MoSi$_2$ and SiC phases by solid-state displacement reaction with MoC phase. As the deposition time increases, the deposited Si was inwardly diffused through the MoSi$_2$—SiC nanocomposite coating layer, and reacted with the MoC coating layer to form new MoSi$_2$ and SiC particles, thereby manufacturing the MoSi$_2$-(30–33) vol. % SiC nanocomposite coating layer.

In Example 3, the MoSi$_2$-(30–33)vol. % SiC nanocomposite coating layer was grown in proportion to a square root of the deposition time of silicon. Therefore, the deposition temperature and time for manufacturing a specific thickness of nanocomposite coating layer could be kinetically calculated.

As explained in Example 1, the substrates coated with the predetermined thickness of MoC coating layer were buried in powders having a composition of (1–70)wt % Si/(1–10)wt % NaF/(20–98)wt % Al$_2$O$_3$, and pack-siliconized at 1100° C. for 10 hours, thereby manufacturing the MoSi$_2$-(30–33) vol. % SiC nanocomposite coating layer.

Figure 3A:
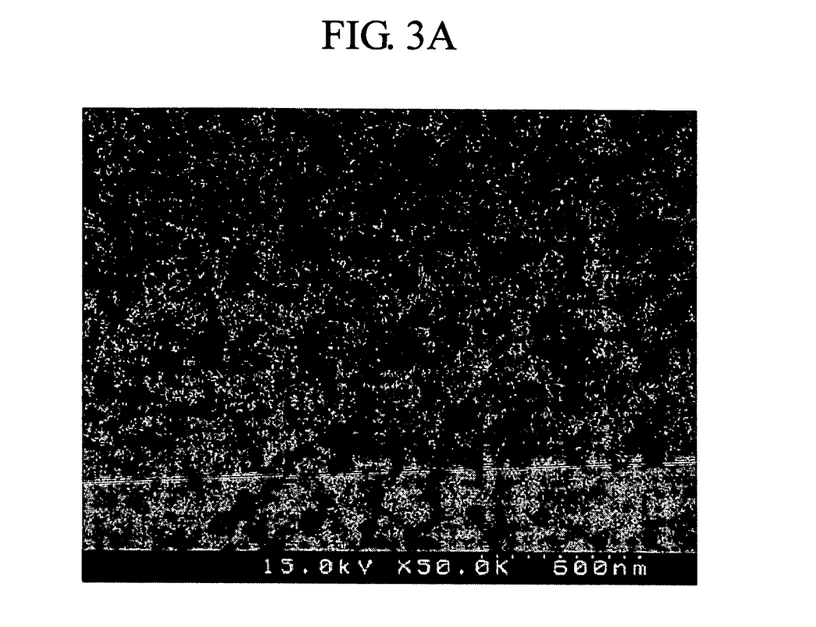
FIGS. 3a and 3b are an SEM photograph and an OM photograph, respectively showing a cross section and a surface of an MoSi$_2$-(30–33)vol. % SiC nanocomposite coating layer formed on a surface of an Nb substrate according to a manufacturing method of Example 3 in accordance with the present invention.
Figure 3B:
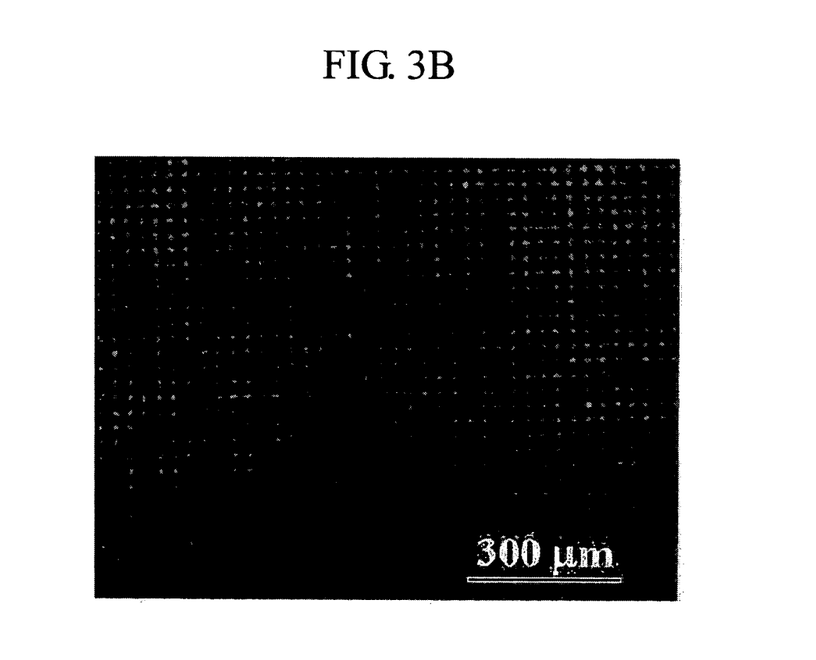

FIGS. 3a and 3b are a backscattering SEM photograph and an OM photograph, respectively showing the cross-section and the surface of the MoSi$_2$-(30–33) vol. % SiC nanocomposite coating layer. As shown in FIGS. 3a and 3b, ultrafine SiC particles were mostly precipitated on an equi-axed MoSi$_2$ grain boundary. When measured by an image analyzer, an average size of equiaxed MoSi$_2$ grains ranges from about 100 to 150 nm, and an average size and a volume fraction of SiC precipitated particles are about 30 to 70 nm and 30 to 33%, respectively.

Differently from the surface microstructure of the monolithic MoSi$_2$ coating layer manufactured by conventional method (refer to FIG. 1b) and the surface microstructure of the MoSi$_2$-(18–20) vol. % SiC nanocomposite coating layer manufactured according to Example 1 (refer to FIG. 2b), no cracks are observed on the surface structure of the MoSi$_2$-(30–33) vol. % SiC nanocomposite coating layer manufactured on the Nb substrate according to the method of Example 3 (refer to FIG. 3b).

When the monolithic MoSi$_2$ coating layer, the MoSi$_2$-(18–20) vol. % SiC nanocomposite coating layer and the MoSi$_2$-(30–33) vol. % SiC nanocomposite coating layer were coated at 1100° C. on the surfaces of the Mo, Nb, Ta and W substrates according to the methods of Examples 1 to 3, and cooled to a room temperature, crack density generated by a thermal stress due to the mismatch in thermal expansion coefficients between the coating layers and the substrates will now be compared, and the low-temperature repeated thermal cyclic oxidation resistances thereof will now be compared.

Comparative Example 1

Figure 4:
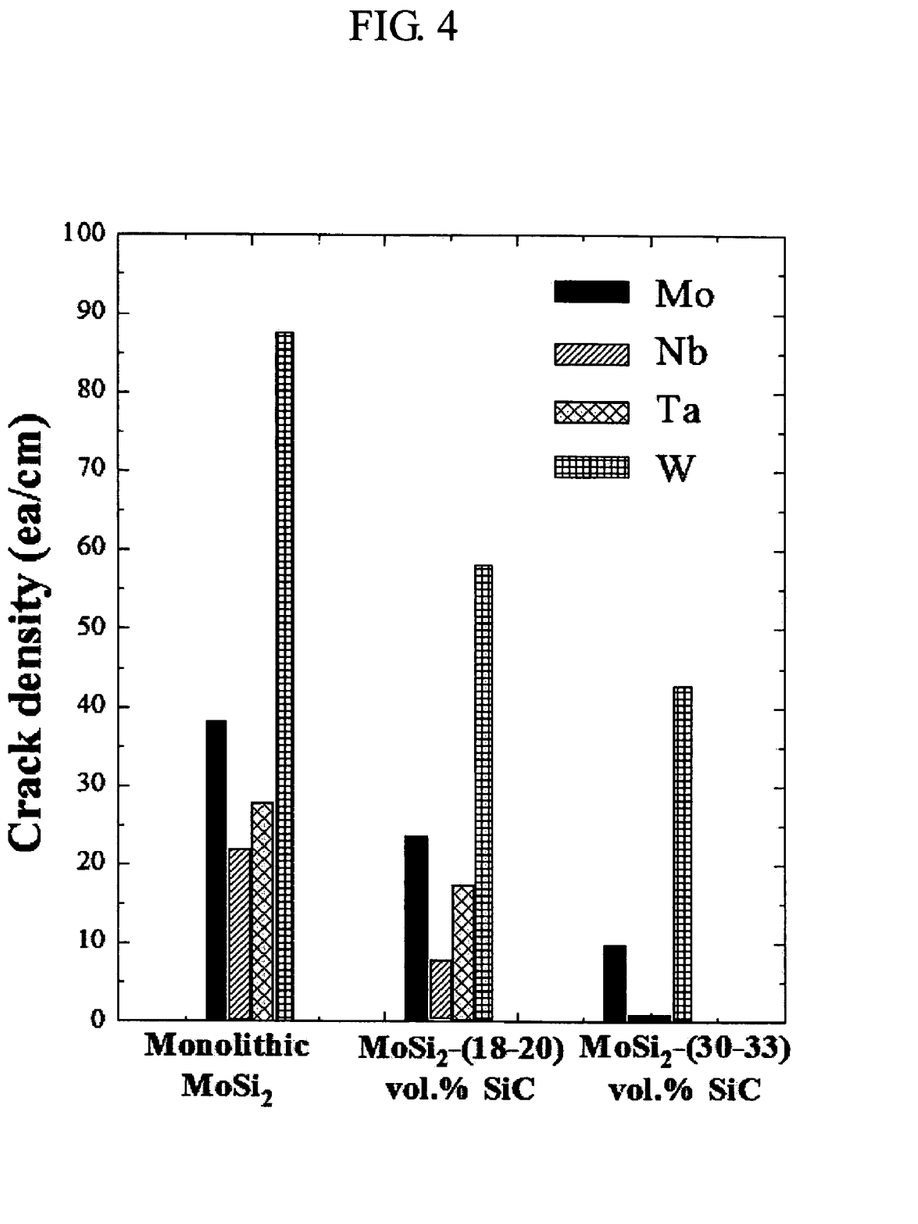
FIG. 4 is a graph showing crack density (the number of cracks per unit length of linear inspection on the cross-section) measured in the cross-section of the monolithic MoSi$_2$ coating layer, the MoSi$_2$-(18–20) vol. % SiC nanocomposite coating layer and the MoSi$_2$-(30–33) vol. % SiC nanocomposite coating layer formed on surfaces of Mo, Nb, Ta and W substrates, respectively, according to the manufacturing methods of Examples 1, 2 and 3 in accordance with the present invention.
Figure 5:
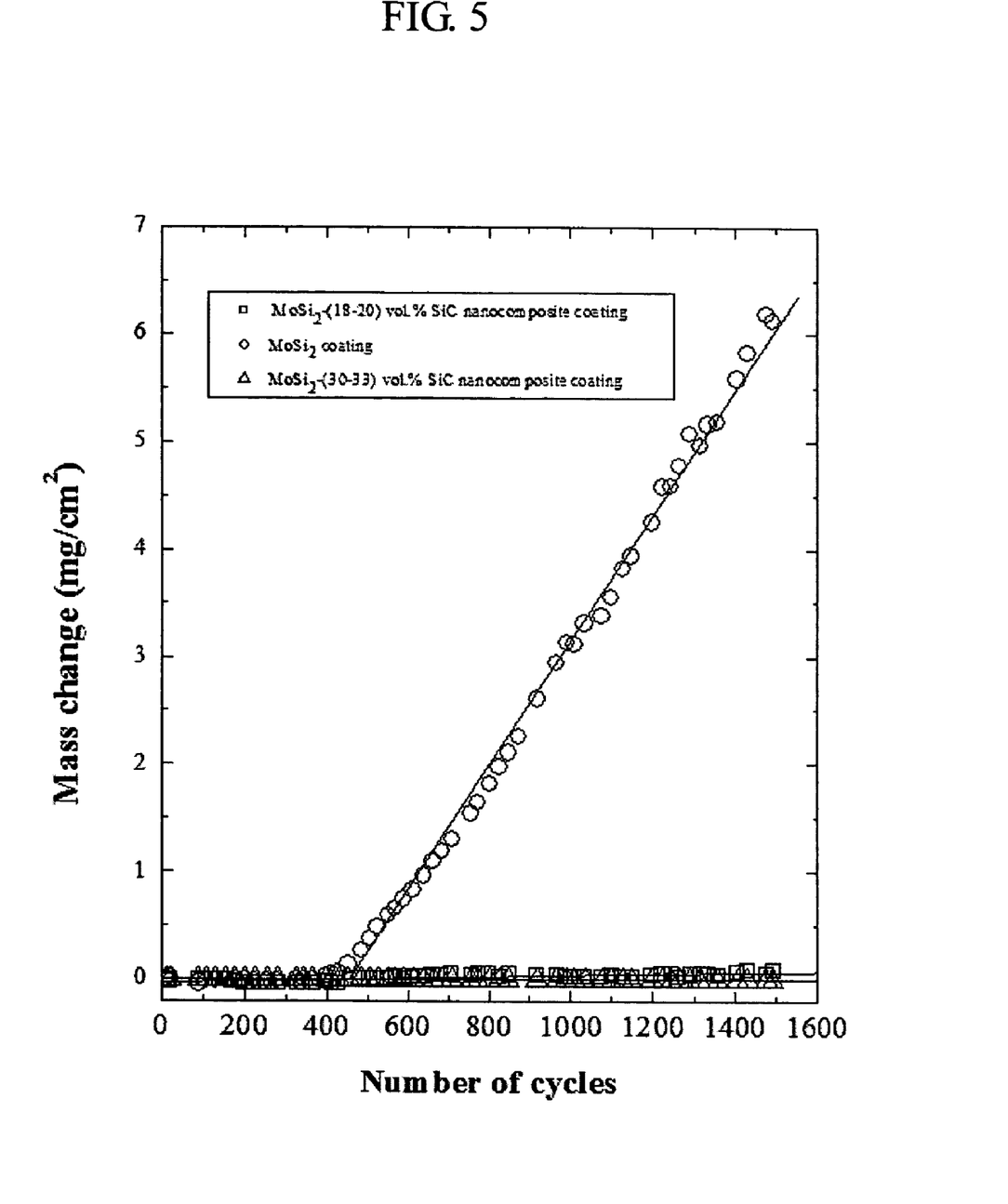
FIG. 5 is a graph showing low temperature cyclic oxidation resistance properties of an Mo sample coated with 50 μm-MoSi$_2$ layer, an Mo sample coated with 60 μm-MoSi$_2$-(18–20) vol. % SiC nanocomposite coating layer manufactured in Examples 1 and 2, and an Mo sample coated with 60 μm-MoSi$_2$-(30–33) vol. % SiC nanocomposite coating layer manufactured in Example 3 under the air at 500° C.

A MoSi$_2$ coating layer, an MoSi$_2$-(18–20) vol. % SiC nanocomposite coating layer and an MoSi$_2$-(30–33) vol. % SiC nanocomposite coating layer were coated at 1100° C. at a thickness of 50 to 60 μm on the surfaces of the Mo, Nb, Ta and W substrates according to the methods of Examples 1 to 3. The coated substrates were furnace-cooled to a room temperature to obtain test samples. A number of cracks per unit length of linear inspection on the cross-section of each coating layer were measured by observing sectional microstructures of the test samples. FIG. 4 shows the influence of volume fractions of SiC particles existing in the MoSi$_2$ coating layer on crack density according to kinds of substrates.

As shown in FIG. 4, in the case of Mo substrate, crack density of the monolithic MoSi$_2$ coating layer was about 37 per cm, crack density of the MoSi$_2$-(18–20) vol. % SiC nanocomposite coating layer was about 24 per cm, and crack density of the MoSi$_2$-(30–33) vol. % SiC nanocomposite coating layer was about 10 per cm. As the volume fraction of the SiC particles existing in the MoSi$_2$ coating layer increased, the crack density remarkably decreased. Therefore, when the MoSi$_2$—SiC nanocomposite coating layer was formed on the surface of the Mo substrate, the volume fraction of the SiC particles had to be over 30% to completely prohibit generation of cracks. In the case of the Nb and Ta substrates, crack densities of the monolithic MoSi$_2$ coating layers are about 22 and 27 cracks per cm, crack density of the MoSi$_2$-(18–20) vol. % SiC nanocomposite coating layers are about 8 and 17 cracks per cm, and no cracks were formed in the MoSi$_2$-(30–33) vol. % SiC nanocomposite coating layers. However, in the case of W substrate having the lowest thermal expansion coefficient among the refractory metals, crack density of about 87 per cm were observed on the monolithic MoSi$_2$ coating layer, and crack densities in the MoSi$_2$-(18–20) vol. % SiC nanocomposite coating and MoSi$_2$-(30–33) vol. % SiC nanocomposite coating are about 58 and 43 per cm, respectively. In accordance with the present invention, the nanocomposition of MoSi$_2$ phase and SiC particles, which do not react with MoSi$_2$ and have excellent high-temperature oxidation resistance and a relatively low thermal expansion coefficient, are practically possible and the control of volume fraction of SiC particles existing in the nanocomposite coatings can reduce remarkably the crack density or can form no cracks in the nanocomposite coating manufactured on the Mo, Nb, Ta, W, and their alloys.

Comparative Example 2

The following low-temperature repeated thermal cyclic oxidation resistance test was performed with respect to a Mo sample coated with 50 μm-MoSi$_2$ layer, a Mo sample coated with 60 μM—MoSi$_2$-(18–20) vol. % SiC nanocomposite coating layer manufactured in Example 1, and an Mo sample coated with 60 μm-MoSi$_2$-(30–33) vol. % SiC nanocomposite coating layer manufactured in Example 3.

One cycle of low-temperature repeated thermal cyclic oxidation test was performed according the following steps of: i) putting the three samples on an alumina boat at the same time, ii) inserting the samples into a heating zone of a horizontal furnace preheated in air of 500° C. by using an automatic conveying device, iii) heating the samples for 55 minutes, and iv) air-cooling the samples for 5 minutes. The low-temperature repeated thermal cyclic oxidation resistance was regularly measured from mass change of the samples per unit area by using an electronic balance having resolution of $10^{-5}$ g.

In the case of the Mo sample coated with the MoSi$_2$ layer, the mass of the sample was not varied until about 454 cycles, but then was sharply increased linearly proportional to the number of the repeated cycles. After about 1500 cyclic tests, the mass of the sample was increased by about 6.2 mg/cm$^2$. After the test, a large amount of MoO$_3$ and SiO$_2$ powders (products due to pest oxidation) were observed on the surface of the coating layer.

However, in the case of the Mo sample coated with the MoSi$_2$-(18–20) vol. % SiC nanocomposite coating layer, even after about 1500 cyclic tests, the mass of the sample was merely increased by about 0.1 mg/cm$^2$. In addition, in the case of the Mo sample coated with the MoSi$_2$-(30–33) vol. % SiC nanocomposite coating layer, even after about 1500 cycles, the mass of the sample was only increased by about 0.03 mg/cm$^2$. Excellent low-temperature repeated thermal cyclic oxidation resistance properties (without powders generated due to the pest oxidation) were obtained on the surfaces of the nanocomposite coating layers according to the present invention.

As discussed earlier, in accordance with the present invention, the whole process of the coating layer is simple and economically advantageous. The MoSi$_2$—SiC nanocomposite coating layer prepared by forming fine SiC particles on the equiaxed MoSi$_2$ grain boundary is manufactured on the surfaces of the refractory metals such as Mo, Nb, Ta, W and their alloys.

The thermal expansion coefficients of the nanocomposite coating layer become close to that of the substrate by controlling the volume fraction of the SiC particles in the nanocomposite coating layer, so that the formation of the fine cracks in the MoSi$_2$—SiC nanocomposite coating layer by the mismatch in the thermal expansion coefficient and the coating layer and the substrate can be restricted or completely removed, thereby increasing the high-temperature repeated thermal cylcic oxidation resistance. In addition, SiC particles formed mostly on the MoSi$_2$ grain boundary restrict the diffusion of oxygen through the grain boundary, thereby increasing the low-temperature oxidation resistance. Furthermore, mechanical properties of the nanocomposite coating layer can be improved by miniaturizing the grains (restriction of formation of fine cracks by thermal stress).

As the present invention may be embodied in several forms without departing from the spirit or essential characteristics thereof, it should also be understood that the above-described embodiments are not limited by any of the details of the foregoing description, unless otherwise specified, but rather should be constructed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A manufacturing method of a $MoSi_2$-SiC nanocomposite coating layer, comprising:

depositing carbon on a surface of Mo or Mo-base alloys to form a $Mo_2C$ diffusion layer; and depositing silicon on the surface of the $Mo_2C$ diffusion layer to form a $MoSi_2$-(18–20) vol. % SiC nanocomposite coating layer by a solid-state displacement reaction.

2. The manufacturing method of claim 1, wherein a source of said carbon is one selected from the group consisting of CO, $CH_4$, $C_2H_4$ and $CH_2I_2$.

3. The manufacturing method of claim 1, wherein a source of said silicon is one selected from the group consisting of $SiCl_4$, $SiH_2Cl_2$, $SiH_3Cl$ and $SiH_4$.

4. The manufacturing method of claim 1, wherein a source of said silicon is pack siliconizing powders having a composition of (1–70)wt % Si/(1–10)wt % NaF/(20–98)wt % $Al_2O_3$.

5. The method of claim 1, wherein said coating layer has a microstructure that SiC particles are dispersed on an equiaxed $MoSi_2$ grain boundary and an SiC volume fraction of the coating layer ranges from 18 to 33%.

6. A manufacturing method of a $MoSi_2$-SiC nanocomposite coating layer, comprising:

depositing simultaneously Mo and carbon on a surface of Mb, Nb, Ta, W, or their alloy to form a $Mo_2C$ coating layer; and depositing silicon on the surface of the $Mo_2C$ coating layer to form a $MoSi_2$-(18–20) vol. % SiC nanocomposite coating layer by a solid-state displacement reaction.

7. The manufacturing method of claim 6, wherein a source of said carbon is one selected from the group consisting of CO, $CH_4$, $C_2H_4$ and $CH_2I_2$, and a source of said Mo is one selected from the group consisting of $Mo(CO)_6$, $MoF_6$ and $MoCl_5$.

8. The manufacturing method of claim 6, wherein a source of said silicon is one selected from the group consisting of $SiCl_4$, $SiH_2Cl_2$, $SiH_3Cl$ and $SiH_4$.

9. The manufacturing method of claim 6, wherein a source of said silicon is pack siliconizing powders having a composition of (1–70)wt % Si/(1–10)wt % NaF/(20–98)wt % $Al_2O_3$.

10. The method of claim 6, wherein said coating layer has a microstructure that SiC particles are dispersed on an equiaxed $MoSi_2$ grain boundary and an SiC volume fraction of the coating layer ranges from 18 to 33%.

11. A manufacturing method of a $MoSi_2$—SiC nanocomposite coating layer, comprising:

depositing simultaneously Mo and carbon on a surface of Mo, Nb, Ta, W, or their alloy to form a MoC coating layer by; and depositing silicon on the surface of the MoC coating layer to form a $MoSi_2$-(30–33)vol. % SiC nanocomposite coating layer by a solid-state displacement reaction.

12. The manufacturing method of claim 11, wherein a source of said carbon is one selected from the group consisting of CO, $CH_4$, $C_2H_4$ and $CH_2I_2$, and a source of said Mo is one selected from the group consisting of $Mo(CO)_6$, $MoF_6$ and $MoCl_5$.

13. The manufacturing method of claim 11, wherein a source of said silicon is one selected from the group consisting of $SiCl_4$, $SiH_2Cl_2$, $SiH_3Cl$ and $SiH_4$.

14. The manufacturing method of claim 11, wherein a source of said silicon is pack siliconizing powders having a composition of (1–70)wt % Si/(1–10)wt % NaF/(20–98)wt % $Al_2O_3$.

15. The method of claim 11, wherein said coating layer has a micro structure that SiC particles are dispersed on an equiaxed $MoSi_2$ grain boundary and an SiC volume fraction of the coating layer ranges from 18 to 33%.

* * * * *